(12) United States Patent
Mutnury et al.

(10) Patent No.: US 9,678,137 B2
(45) Date of Patent: Jun. 13, 2017

(54) SYSTEM AND METHOD TO MONITOR CONTACT JOINT INTEGRITY

(71) Applicants: Bhyrav M. Mutnury, Round Rock, TX (US); Sandor Farkas, Round Rock, TX (US); Wallace H. Ables, Georgetown, TX (US)

(72) Inventors: Bhyrav M. Mutnury, Round Rock, TX (US); Sandor Farkas, Round Rock, TX (US); Wallace H. Ables, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 461 days.

(21) Appl. No.: 14/190,850

(22) Filed: Feb. 26, 2014

(65) Prior Publication Data
US 2015/0241504 A1    Aug. 27, 2015

(51) Int. Cl.
*G01R 31/04*    (2006.01)
(52) U.S. Cl.
CPC ................. *G01R 31/048* (2013.01)
(58) Field of Classification Search
CPC ..................................... G01R 31/04
See application file for complete search history.

(56) References Cited

U.S. PATENT DOCUMENTS

| 6,104,563 A * | 8/2000 | Dovek ................... G11B 5/012 360/66 |
| 6,424,513 B1 | 7/2002 | Wissell et al. |
| 9,350,155 B2 | 5/2016 | Petivan et al. |
| 2006/0194327 A1* | 8/2006 | Kahlan .............. G01N 15/0656 436/86 |
| 2006/0294437 A1 | 12/2006 | Washburn et al. |
| 2007/0159193 A1* | 7/2007 | Min ..................... G11B 9/1409 324/754.27 |
| 2009/0058435 A1* | 3/2009 | Nakamura ............. G01R 27/14 324/719 |
| 2012/0120577 A1 | 5/2012 | Chun et al. |
| 2012/0176149 A1* | 7/2012 | Yamayose ........... H05K 1/0268 324/750.3 |
| 2013/0169302 A1* | 7/2013 | Ricci .................. G01R 31/2887 324/750.25 |

OTHER PUBLICATIONS

U.S. Appl. No. 14/150,095, 43 pages, Jan. 8, 2014.

\* cited by examiner

*Primary Examiner* — Jermele M Hollington
*Assistant Examiner* — Feba Pothen
(74) *Attorney, Agent, or Firm* — Baker Botts L.L.P.

(57) ABSTRACT

Methods and systems for monitoring contact joint integrity in an information handling system may include precisely monitoring a change in resistance of a resistive element associated with a contact joint. The change in resistance of the resistive element may be indicative of the integrity of the contact joint. The resistance may be measured using a modulated current source and by demodulating a voltage signal resulting from the modulated current flowing across the resistive element.

20 Claims, 5 Drawing Sheets

MODULATED DRIVER

FIG. 5A

DEMODULATOR

FIG. 5B

SYSTEM AND METHOD TO MONITOR CONTACT JOINT INTEGRITY

BACKGROUND

Field of the Disclosure

This disclosure relates generally to information handling systems and more particularly to a system and method to monitor contact joint integrity in information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In various information handling systems, contacts between circuit board pads and electronic components connectors, such as ball grid array (BGA) assemblies used to mount integrated circuits (ICs or chips), may be realized using solder joints. Such solder joints and/or other types of connections may be subject to mechanical stress after initial testing, during assembly, and/or during an operational lifetime of an information handling system. The mechanical stress (or other factors) may lead to degradation of the joined contacts, for example, as a result of micro-fractures in solder joints. The degradation of joined contacts in an information handling system may be difficult to detect and/or predict.

SUMMARY

In one aspect, a disclosed method for monitoring contact joint integrity includes supplying a modulated current to a resistive element at a contact joint in an information handling system, the modulated current being modulated at a first frequency. The method may include amplifying a modulated voltage signal at the resistive element, the modulated voltage signal resulting from the modulated current flowing through the resistive element, and demodulating, using the first frequency, the amplified modulated voltage signal to result in an output voltage signal that is a direct current (DC) signal. The method may further include monitoring the output voltage signal to register a voltage change indicative of a change in resistance of the resistive element.

Other disclosed aspects include a test circuit for monitoring contact joint integrity and an information handling system including a test circuit for monitoring contact joint integrity.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Additionally, the information handling system may include firmware for controlling and/or communicating with, for example, hard drives, network circuitry, memory devices, I/O devices, and other peripheral devices. As used in this disclosure, firmware includes software embedded in an information handling system component used to perform predefined tasks. Firmware is commonly stored in non-volatile memory, or memory that does not lose stored data upon the loss of power. In certain embodiments, firmware associated with an information handling system component is stored in non-volatile memory that is accessible to one or more information handling system components. In the same or alternative embodiments, firmware associated with an information handling system component is stored in non-volatile memory that is dedicated to and comprises part of that component.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1, 2, 3, 4, 5A and 5B wherein like numbers are used to indicate like and corresponding parts.

Figure 1:
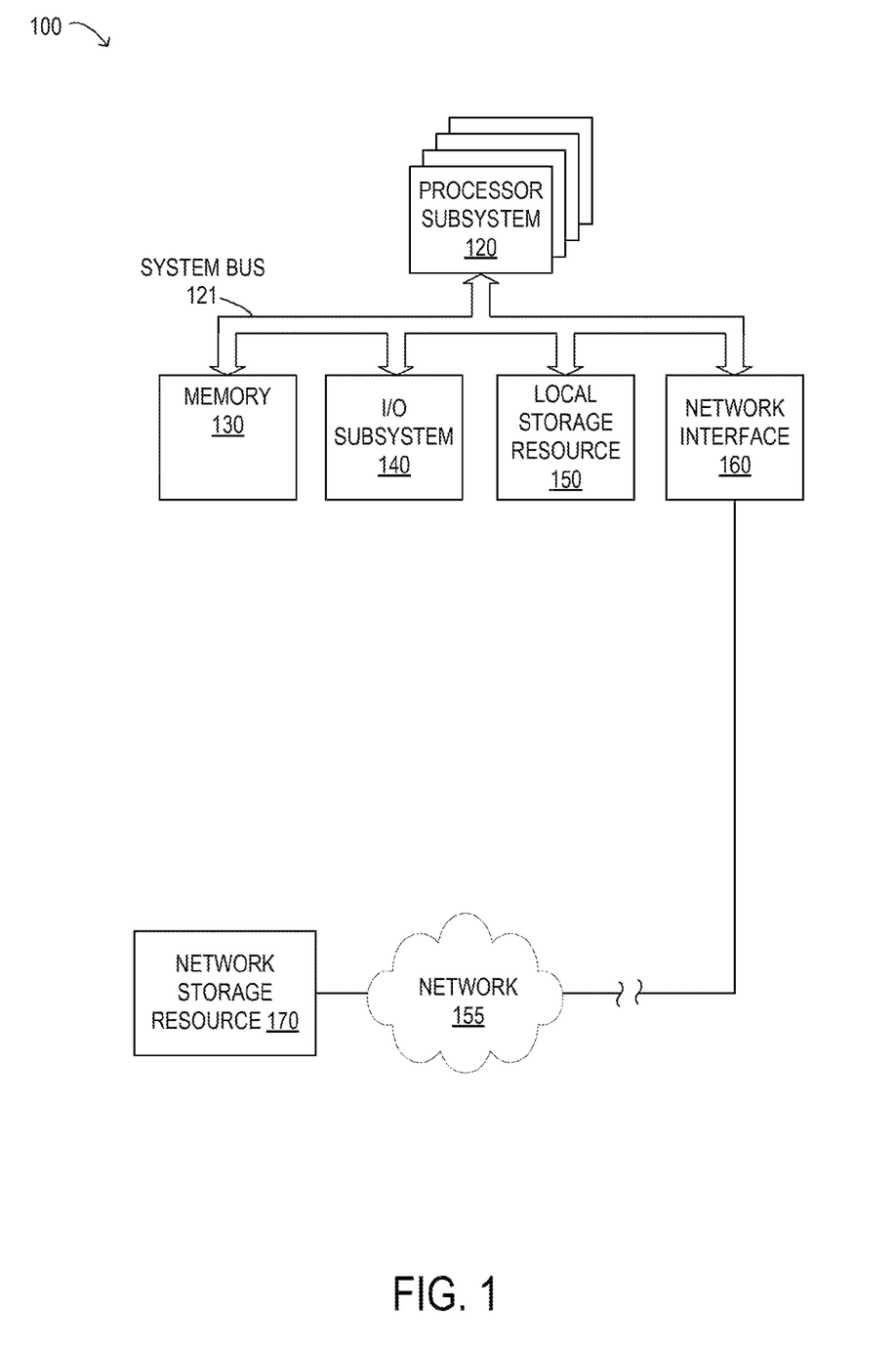
FIG. 1 is a block diagram of selected elements of an embodiment of an information handling system.

Turning now to the drawings, FIG. 1 illustrates a block diagram depicting selected elements of an embodiment of information handling system 100. Also shown with information handling system 100 are external or remote elements, namely, network 155 and network storage resource 170.

As shown in FIG. 1, components of information handling system 100 may include, but are not limited to, processor subsystem 120, which may comprise one or more processors, and system bus 121 that communicatively couples various system components to processor subsystem 120 including, for example, memory subsystem 130, I/O subsystem 140, local storage resource 150, and network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

In FIG. 1, network interface 160 may be a suitable system, apparatus, or device operable to serve as an interface between information handling system 100 and a network 155. Network interface 160 may enable information handling system 100 to communicate over network 155 using a suitable transmission protocol and/or standard, including, but not limited to, transmission protocols and/or standards enumerated below with respect to the discussion of network 155. In some embodiments, network interface 160 may be communicatively coupled via network 155 to network storage resource 170. Network 155 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof. In certain embodiments, system 100 and network 155 may be included in a rack domain.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of physical hardware 102). In the same or alternative embodiments, processor subsystem 120 may interpret and/or execute program instructions and/or process data stored remotely (e.g., in a network storage resource).

Also in FIG. 1, memory subsystem 130 may comprise a system, device, or apparatus operable to retain and/or retrieve program instructions and/or data for a period of time (e.g., computer-readable media). As shown in the example embodiment of FIG. 1, memory subsystem 130 stores user-personalized wake policy 132, which may represent instructions executable by processor subsystem 120 to implement the methods described herein. It is noted that in different embodiments, user-personalized wake policy 132 may be stored at network storage resource 170 and may be accessed by processor subsystem 120 via network 155 Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as information handling system 100, is powered down.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. For example, local storage resource 150 may store executable code in the form of program files that may be loaded into memory subsystem 130 for execution, such as user-personalized wake policy 132. In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In certain embodiments, I/O subsystem 140 may comprise a touch panel and/or a display adapter. The touch panel (not shown) may include circuitry for enabling touch functionality in conjunction with a display (not shown) that is driven by display adapter (not shown).

As will be described in further detail, information handling system 100, or certain components included therein, may include various contact joints that may degrade over time. Additionally, certain types contact joints, such as solder joints in a BGA assembly, may be outfitted with isolated pads and/or other structures having a relatively low resistance. For example, U.S. application Ser. No. 14/150,095, filed on Jan. 8, 2014, entitled "Memory Short Protection System" describes a solution to improve BGA solder joint consistency during reflow by including spacer pads to provide a mechanical stand-off that relieves stress on the BGA solder joints. The spacer pads themselves are resistive elements having a relatively low resistance and are isolated from other electrical elements of the information handling system. By equipping the spacer pads with external contacts, the change in resistance of the spacer pads, either singly or in a daisy chain arrangement, may be monitored over time. This change in resistance may provide an indirect indication of the health of the BGA solder joints due to common mechanical stresses between the BGA solder joints and the spacer pads. In this manner, monitoring of the change in resistance may be used for predictive failure analysis, real-time monitoring, and/or other applications to provide an indication of the health of the BGA solder joints before a failure occurs, thereby enabling a more controlled and less costly operation of the information handling system. It is noted that although the example application above is described with respect to BGA solder joints, various types of contact joints and/or mechanical stresses at contact joints may be monitored using the systems and methods described herein for precise resistance measurements in an information handling system.

It is noted that other methods than the methods described herein to monitor contact joints and/or to detect microfractures in solder joints may involve significant disadvantages and difficulties. Certain known methods are destructive methods that involve cross-sectioning a sample of the solder joint and physical examination, for example, by microscopy, which are less desirable methods than non-destructive methods. Non-destructive methods include X-ray analysis, which may not provide sufficient resolution and may be impractical in many operational instances. Furthermore, resistance monitoring of contact pads and/or contact joints in modern electronic components often involves precision resistance measurements in the milliohm to microohm range to detect meaningful changes of about 20% change in resistance or less. Conventional resistance measurements may be poorly suited for measurement of resistance in the milliohm to microohm range due to the relatively high current supply to result in a measurable voltage at an acceptable signal-to-noise ratio. Such high currents to drive a desirable output voltage may be impractical to apply in the vicinity of a circuit board of an information handling system.

Figure 2:
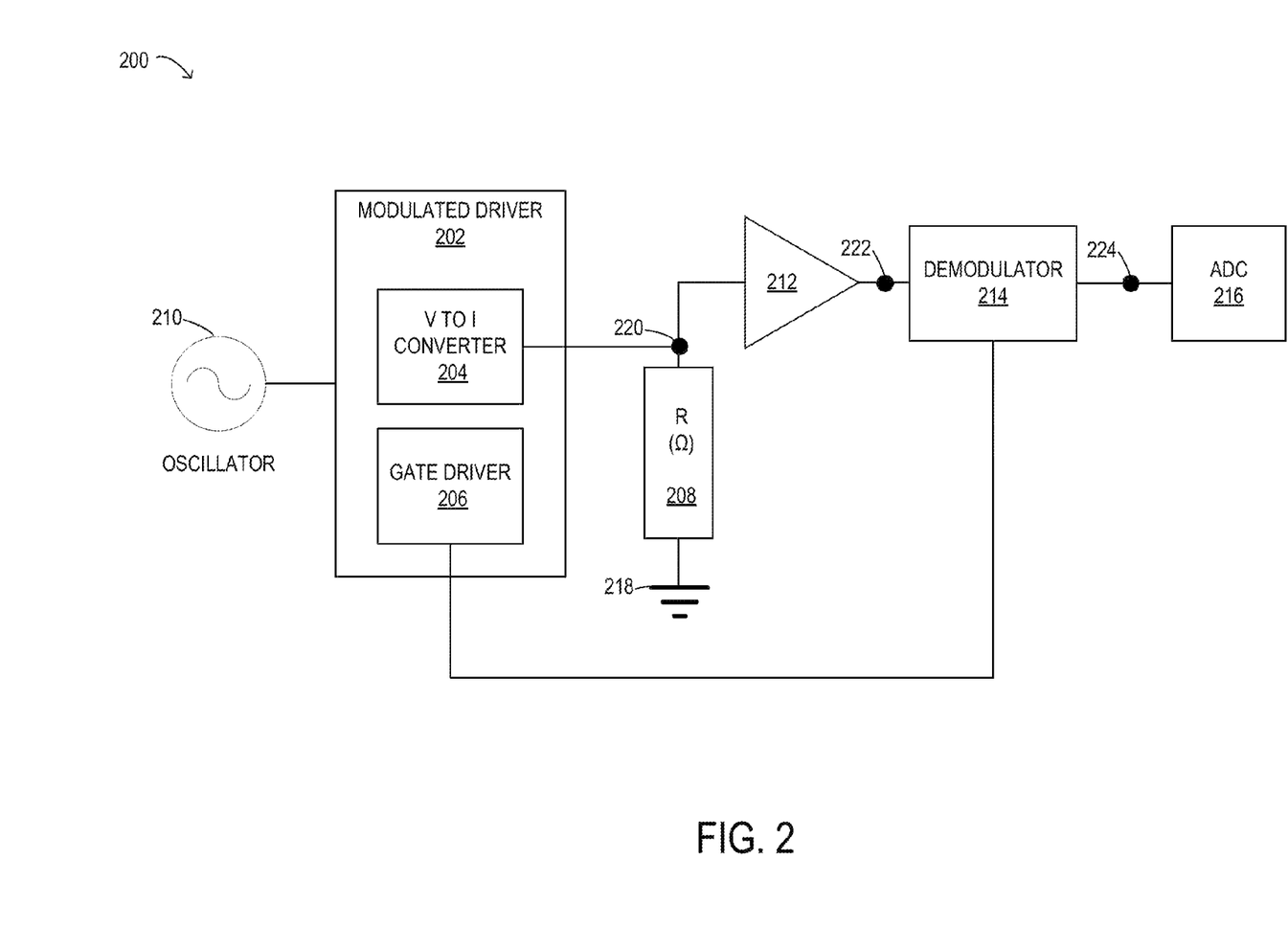
FIG. 2 is a block diagram of selected elements of an embodiment of test circuit.

Referring now to FIG. 2, a block diagram of selected elements of an embodiment of test circuit 200 for monitoring contact joint integrity in an information handling system is presented. As shown, test circuit 200 may be used to measure resistance of resistive element 208, which may represent a resistive element included in information handling system 100 (see FIG. 1). In various embodiments, the resistance of resistive element 208 may be indicative of contact joint integrity of a contact joint (not shown) in information handling system 100, such that, when a change in the resistance occurs, a change in the joint integrity of the contact joint may occur. The contact joint may be any of a variety of different types of contact joints, such as solder joints, plug-in type connector joints, circuit board connector joints, IC connector joints, and/or other electrical contact joints. In particular embodiments, resistive element 208 may represent a resistance of the contact joint itself. In other embodiments, resistive element 208 may be mechanically coupled to the contact joint, but may be electrically isolated from the contact joint. Thus, a change in resistance of resistive element 208 may indicate a mechanical change in the contact joint. For example, when the contact joint is a solder joint, a change in resistance of resistive element 208 may indicate or may be associated to a certain extent with a microfracture in the solder joint. In various embodiments, resistive element 208 may represent a collective resistance of a plurality of contact joints, for example, when a plurality of resistive elements are connected in series. It is noted that resistive element 208 may be a conductor with a very low resistance due to a conductive material with which resistive element 208 is formed and/or due to physical dimensions of resistive element 208.

As shown in test circuit 200 of FIG. 2, a modulated current source may be used for resistance measurements with synchronous recovery. Specifically, oscillator 200 may represent a clock source at a first frequency. In certain embodiments, oscillator 200 and/or another frequency source may be external to test circuit 200, such that a clock input in provided to test circuit 200. The clock at the first frequency may be received at modulated driver 202, which may include voltage to current converter 204 and gate driver 206. A current modulated at the first frequency may be output from voltage to current converter 204 to resistive element 208, which is connected to ground terminal 218. At circuit node 220, a modulated voltage signal may be received by amplifier 212, resulting from the current flowing through resistive element 208 to ground terminal 218. An amplified modulated voltage signal at the first frequency may be output at circuit node 222 to demodulator 214, which may also receive the first frequency as a voltage signal from gate driver 206. Demodulator 214 may demodulate the amplified modulated voltage signal to result in a direct current (DC) output voltage signal at circuit node 224, which may then be digitized by analog-to-digital converter (ADC) 216. After being digitized at ADC 216, data representing the DC output voltage signal may be stored, recorded, monitored, and/or otherwise processed in the digital domain (not shown).

In FIG. 2, test circuit 200 may further be supplied with a standard 12V power input, which is well suited for application in various information handling systems, such as in a server backplane environment. The first frequency may be relatively low and may generally be less than about 20 hertz (Hz). The output voltage signal at circuit node 224 may be proportional to a resistance of resistive element 208. The processing in the digital domain (not shown) may include detecting and storing minimum and maximum readings for comparison over a service life of the information handling system. When a maximum reading exceeds a minimum and/or a normal reading by more than about 20% of one joint resistance, an indication that a contact joint associated with resistive element 208 has degraded may be recorded. When the contact joint is a solder joint, the degradation may represent a microfracture in the solder joint.

In operation, improved accuracy of test circuit 200 may be achieved when a normal operating temperature of the information handling system is reached to avoid any undesired thermal effects that may distort the resistance of resistive element 208. A modulated current amplitude of less than about 500 milliamperes may be used in test circuit 200. Test circuit 200 may be operable to measure resistances and changes in resistance in the microohm range. In practical applications, test circuit 200 may have a detection limit of less than 5% of a resistance of resistive element 208. When resistive element 208 includes a plurality of resistive elements in series (not shown), a number of resistive elements in the plurality of resistive elements may be limited to improve a resistance detection limit of test circuit 200. In certain embodiments, resistive element may include first portions whose resistance does not change over time (i.e., fixed elements such as circuit board traces, pads, vias, etc.)

as well as second portions whose resistance may change over time (i.e., connectors, solder joints, soldered pads, removable elements, etc.). It is noted that test circuit 200 may be implemented with relatively low-cost off-the-shelf electronic components and may be miniaturized to fit in various applications in different types of information handling systems. Test circuit 200 may be used for production test and validation as well as for real time monitoring of an information handling system while in operation. In certain embodiments, test circuit 200 may be included in an in-circuit test (ICT) equipment. In various embodiments, test circuit 200 may be an external circuit that can be coupled to and removed from the information handling system as desired. In different embodiments, test circuit 200 may be integrated within the information handling system.

Figure 3:
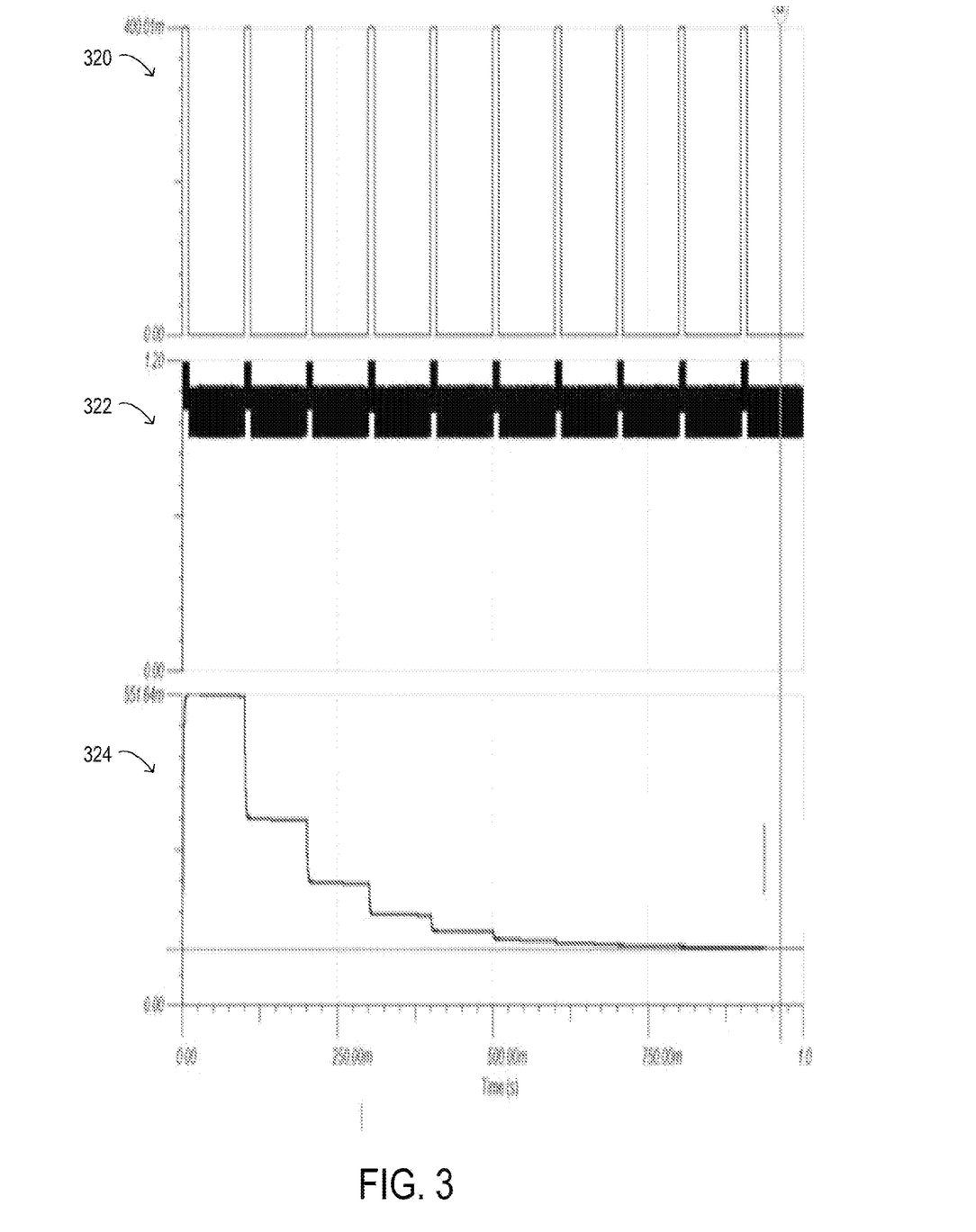
FIG. 3 are plots of signals from an embodiment of the test circuit.

Turning now to FIG. 3, selected signal plots associated with an embodiment of test circuit 200 (see FIG. 2) are depicted as waveform plots versus time. In plot 320, corresponding to circuit node 220, the modulated current signal supplied to resistive element 208 is shown. In one embodiment, plot 322 shows a 10% duty cycle square wave with an amplitude of 400 milliamperes at a frequency of 12 hertz. In plot 322, corresponding to circuit node 222, the amplified modulated voltage signal received at demodulator 214 is shown. In plot 324, corresponding to circuit node 224, the DC voltage signal output by demodulator 214 is shown. The DC voltage signal is shown converging within about 10 clock cycles to a 100 mV value representing 100 microohm resistance in the example embodiment. The converging of the DC voltage signal may result from a parallel capacitor network included in demodulator 214 that operates in a similar manner as a charge pump (see also FIG. 5A).

Figure 4:
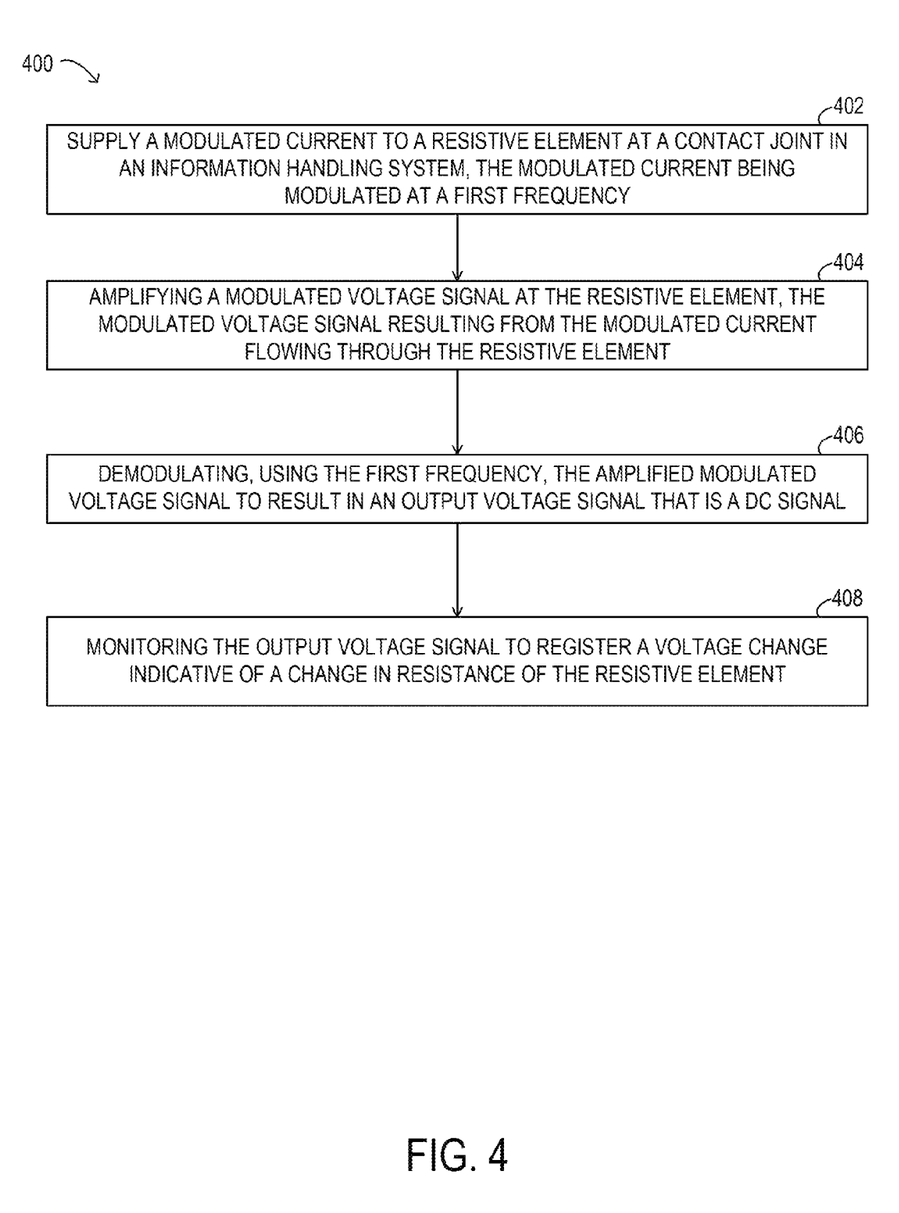
FIG. 4 is a flowchart depicting selected elements of an embodiment of a method for monitoring contact joint integrity.

Turning now to FIG. 4, a block diagram of selected elements of an embodiment of method 400 for monitoring contact joint integrity in an information handling system is depicted in flowchart form. Method 400 may be performed using information handling system 100 (see FIG. 1) and test circuit 200 (see FIG. 2). It is noted that certain operations described in method 400 may be optional or may be rearranged in different embodiments.

Method 400 may begin by supplying (operation 402) a modulated current to a resistive element at a contact joint in an information handling system, the modulated current being modulated at a first frequency. A modulated voltage signal at the resistive element may be amplified (operation 404), the modulated voltage signal resulting from the modulated current flowing through the resistive element. The amplified modulated voltage signal may be demodulated (operation 406) using the first frequency to result in an output voltage signal that is a DC signal. The output voltage signal may be monitored (operation 408) to register a voltage change indicative of a change in resistance of the resistive element. The change in resistance detectable in operation 408 may represent a change in the resistance of the contact joint, which, in turn, may be indicative of a mechanical change of the contact joint. For example, when monitored over time, a certain change in the resistance may indicate a mechanical change in the solder joint that may represent a degradation of the solder joint.

Figure 5A:
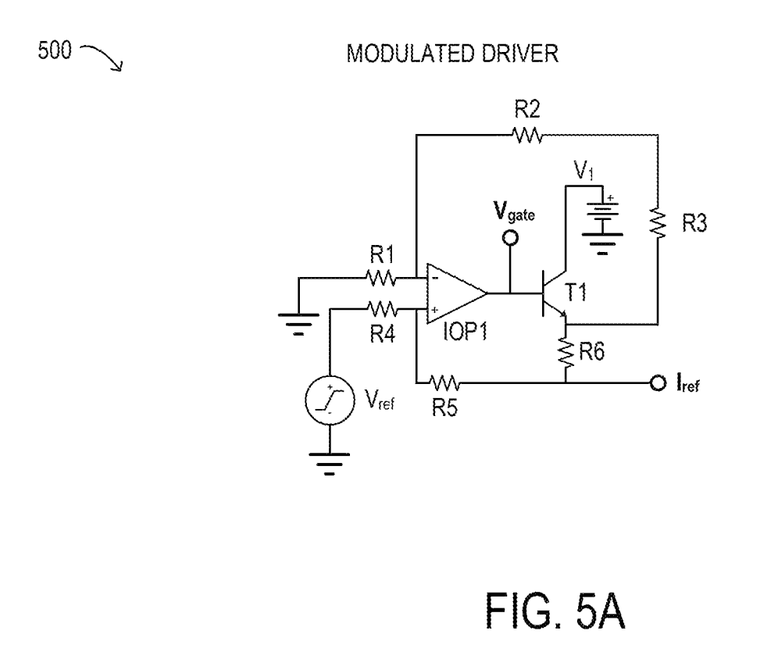
FIGS. 5A and 5B are schematic diagrams of selected elements of embodiments of electrical circuits.

Referring now to FIG. 5A, a schematic diagram of selected elements of an embodiment of modulated driver circuit 500 is presented. In FIG. 5A, modulated driver circuit 500 may represent one embodiment of modulated driver 202 (see FIG. 2). It is noted that, in various embodiments, modulated driver 202 may be implemented using different circuit designs, including modulated driver circuit 500.

In modulated driver circuit 500, $V_{ref}$ may represent a reference voltage source having a precise amplitude and frequency (see oscillator 210 in FIG. 2), while $V_1$ may represent a supply voltage. The output $I_{ref}$ may represent a modulated current that is supplied to a resistive element (not shown in FIG. 5A, see circuit node 220 in FIG. 2), while output $V_{gate}$ may represent an output of gate driver 206 that is synchronous in frequency with $I_{ref}$. It is noted that modulated driver circuit 500 may generate $I_{ref}$ as given by plot 320 (see FIG. 3). In given embodiments, $V_1$ is 12V. As shown, modulated circuit driver 500 may implement a non-inverting current source without the use of a negative supply voltage. The resistor values R1 and R2 may be selected such that $V_{gate}$ may oscillate to just below $V_1$, that is, to a minimum voltage given by Equation 1.

$$V_{ref}*R2/R1<(V_1-0.7) \quad \text{Equation (1)}$$

Thus, a diode drop for T1 is reserved to avoid saturation. As a result, IOP1 will not reach $V_1$ and stays in a closed loop and an accurate current source may be generated. At the same time $V_{gate}$ may oscillate to a high enough voltage to drive MOSFET gates directly (see FIG. 5B). The output current level may be set using R6 since an amplitude of $I_{ref}$ is given by Equation 2.

$$I_{ref}=(R2/R1)*(V_{ref}/R6) \quad \text{Equation (2)}$$

Where high accuracy is desired, the resistor values may be selected in pairs of matching values given by: R1=R2, R4=R5, and R3=R6. In some embodiments (not shown), R2 and R3 may be combined into a single resistor. Using separate resistors for R2 and R3 may facilitate the use of more exact matching values. T1 may be any NPN transistor that is rated for a desired amplitude of the modulated output current, $I_{ref}$.

Figure 5B:
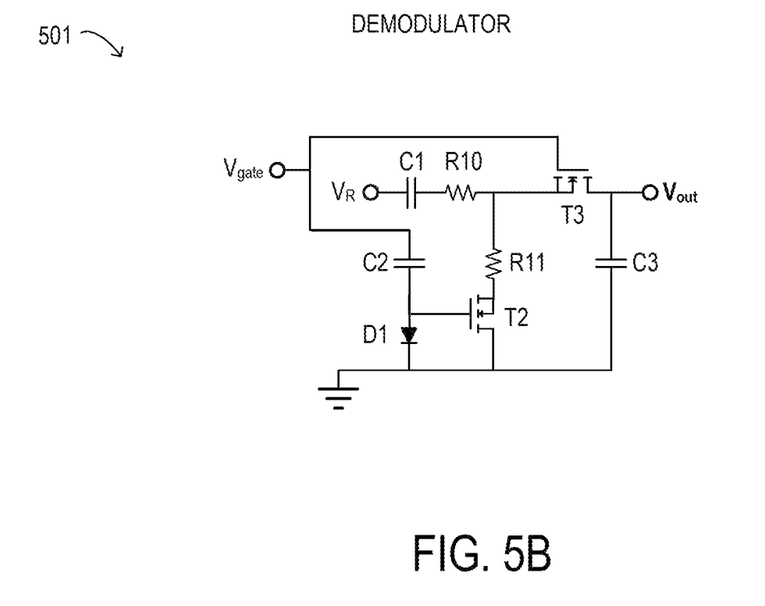

Referring now to FIG. 5B, a schematic diagram of selected elements of an embodiment of demodulator circuit 501 is presented. In FIG. 5B, demodulator circuit 501 may represent one embodiment of demodulator 214 (see FIG. 2). It is noted that, in various embodiments, demodulator 214 may be implemented using different circuit designs, including demodulator circuit 501.

In demodulator circuit 501, $V_{gate}$ may be supplied by a modulated driver, such as modulated driver circuit 500 (see FIG. 5A), while $V_R$ may represent a voltage resulting from $I_{ref}$ flowing through a resistive element, such as resistive element 208 at node 220 (see FIG. 2). In some embodiments, $V_R$ may be an amplified voltage (see node 222 in FIG. 2). The output $V_{out}$ may represent an output of demodulator circuit 501 representing a DC voltage across the resistive element. It is noted that modulated driver circuit 500 may generate $V_{out}$ as given by plot 324 (see FIG. 3).

As shown in demodulator circuit 501 of FIG. 5B, T2 may represent a P-channel MOSFET (P-FET), and T3 may represent an N-channel MOSFET (N-FET). P-FET T2 and N-FET T3 may operate in a manner substantially similar to analog switches, which are controlled by $V_{gate}$ which may be a clock signal synchronous in frequency with $V_{ref}$ having amplitude of $V_1$. Capacitor C2 and diode D1 may form a level shifter to generate negative voltages for the gate input of P-FET T2. Demodulator circuit 501 may serve as an auto-zero circuit when $V_{gate}$ is low. When $V_{gate}$ is low, $I_{ref}$ may be zero, and $V_R$ may represent an amplified sum of offset and bias errors and noise that appear across resistive element 208 (see FIG. 2). When $V_{gate}$ is low, capacitor C2 may remain charged to greater than about 10V (when $V_1$ is 12V), P-FET T2 is switched on and N-FET T3 switched is off. Capacitor C1 and resistors R10 and R11 may form a low pass filter, such that capacitor C1 is charged up to a DC component (offset and bias) of $V_R$ while an uncorrelated AC component (noise) will be rejected. When $V_{gate}$ is high, P-FET T2 is switched off and N-FET T3 is switched on. Since capacitor C1 is in series with $V_R$, the voltage across capacitor C1 will be subtracted from $V_R$ and the remaining voltage difference will charge capacitor C3. Resistor R10 may provide a current limiting function and may form a low pass filter with capacitor C3. After a few clock periods $V_{out}$, the voltage across capacitor C3, may converge to a voltage that accurately represents the resistance of resistive element 208, while noise and other errors may be rejected. Resistor R11 may be used to minimize accuracy errors resulting from cross conduction across P-FET T2 and N-FET T3 during the clock edges.

As disclosed herein, methods and systems for monitoring contact joint integrity in an information handling system may include precisely monitoring a change in resistance of a resistive element associated with a contact joint. The change in resistance of the resistive element may be indicative of the integrity of the contact joint. The resistance may be measured using a modulated current source and by demodulating a voltage signal resulting from the modulated current flowing across the resistive element.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for monitoring contact joint integrity in an information handling system, comprising:
    supplying a modulated current to a resistive element at a contact joint in the information handling system, the modulated current being modulated at a first frequency;
    amplifying a modulated voltage signal at the resistive element, the modulated voltage signal resulting from the modulated current flowing through the resistive element;
    demodulating, using the first frequency, the amplified modulated voltage signal to result in an output voltage signal that is a direct current (DC) signal; and
    monitoring the output voltage signal to register a voltage change indicative of a change in resistance of the resistive element,
    wherein the first frequency is less than 20 hertz.

2. The method of claim 1, wherein the resistive element is mechanically coupled to the contact joint in the information handling system, and wherein the change in resistance of the resistive element indicates a mechanical change in the contact joint.

3. The method of claim 2, wherein the contact joint is a ball grid array contact element and wherein the resistive element is a spacer pad used to offset the ball grid array contact element.

4. The method of claim 1, wherein the resistive element is a contact joint in the information handling system.

5. The method of claim 1, wherein:
    the modulated current has an amplitude of less than 500 milliamperes.

6. The method of claim 1, wherein the change in resistance is less than 5% of a resistance of the resistive element, and wherein the change in resistance occurs in portions of the resistive element.

7. A test circuit for monitoring contact joint integrity in an information handling system, the test circuit comprising:
    a modulated driver to:
        receive a clock input at a first frequency;
        generate a modulated current at the first frequency; and
        generate a gate driver signal at the first frequency; and
    a demodulator to:
        receive a modulated voltage signal resulting from the modulated current flowing through a resistive element at a contact joint in the information handling system; and
        demodulate the modulated voltage signal to result in an output voltage signal that is a direct current (DC) signal, wherein a voltage change in the output voltage signal is indicative of a change in resistance of the resistive element,
    wherein the first frequency is less than 20 hertz.

8. The test circuit of claim 7, wherein the test circuit is removably coupled to the information handling system.

9. The test circuit of claim 7, wherein the test circuit is integrated into a circuit board included with the information handling system.

10. The test circuit of claim 7, wherein the resistive element is mechanically coupled to the contact joint in the information handling system, and wherein the change in resistance of the resistive element indicates a mechanical change in the contact joint.

11. The test circuit of claim 10, wherein the contact joint is a ball grid array contact element and wherein the resistive element is a spacer pad used to offset the ball grid array contact element.

12. The test circuit of claim 7, wherein the resistive element is a contact joint in the information handling system.

13. The test circuit of claim 7, wherein:
    the modulated current has an amplitude of less than 500 milliamperes.

14. The test circuit of claim 7, wherein the change in resistance is less than 5% of a resistance of the resistive element, and wherein the change in resistance occurs in portions of the resistive element.

15. An information handling system comprising a test circuit, the test circuit comprising:
    a modulated driver to:
        receive a clock input at a first frequency;
        generate a modulated current at the first frequency; and
        generate a gate driver signal at the first frequency; and
    a demodulator to:
        receive a modulated voltage signal resulting from the modulated current flowing through a resistive element at a contact joint in the information handling system; and
        demodulate the modulated voltage signal to result in an output voltage signal that is a direct current (DC) signal, wherein a voltage change in the output voltage signal is indicative of a change in resistance of the resistive element,
    wherein the first frequency is less than 20 hertz.

16. The information handling system of claim 15, wherein the resistive element is mechanically coupled to the contact joint in the information handling system, and wherein the change in resistance of the resistive element indicates a mechanical change in the contact joint.

17. The information handling system of claim 16, wherein the contact joint is a ball grid array contact element and wherein the resistive element is a spacer pad used to offset the ball grid array contact element.

18. The information handling system of claim 15, wherein the resistive element is a contact joint in the information handling system.

19. The information handling system of claim 15, wherein:
 the modulated current has an amplitude of less than 500 milliamperes.

20. The information handling system of claim 15, wherein the change in resistance is less than 5% of a resistance of the resistive element, and wherein the change in resistance occurs in portions of the resistive element.

* * * * *